United States Patent [19]
Kim et al.

[11] Patent Number: 6,134,180
[45] Date of Patent: Oct. 17, 2000

[54] SYNCHRONOUS BURST SEMICONDUCTOR MEMORY DEVICE

[75] Inventors: Su-Chul Kim, Seoul; Hee-Choul Park, Sungnam-shi, both of Rep. of Korea

[73] Assignee: Samsung Electronics, Co., Ltd., Suwon, Rep. of Korea

[21] Appl. No.: 09/255,971

[22] Filed: Feb. 23, 1999

[30] Foreign Application Priority Data

Aug. 4, 1998 [KR] Rep. of Korea ................. 98-31950

[51] Int. Cl.$^7$ ................................................. G11C 8/00
[52] U.S. Cl. ................. 365/233; 365/233.5; 365/230.02
[58] Field of Search ..................... 365/233, 233.5, 365/230.02

[56] References Cited

U.S. PATENT DOCUMENTS 5,499,213  3/1996  Niimi et al. ......................... 365/222
5,812,489  9/1998  Matsui ................................ 365/233
5,848,431  12/1998  Pawlowski ............................ 711/5

*Primary Examiner*—Richard Elms
*Assistant Examiner*—Tuan T. Nguyen
*Attorney, Agent, or Firm*—Marger Johnson & McCollom, P.C.

[57] ABSTRACT

A synchronous burst semiconductor memory device with a pipelined multi-bit prefetch architecture includes separate internal address generators for respective read and write burst modes. The synchronous memory device also adopts an auto-tracking bit line scheme to reduce core cycle time, a shortened main data line for current reduction, a noise immune circuit having high-speed transfer characteristics through a dual-rail reset dynamic circuit, and strobe clocks synchronized with the output data to guarantee processor data-validation time.

15 Claims, 5 Drawing Sheets

SYNCHRONOUS BURST SEMICONDUCTOR MEMORY DEVICE

FIELD OF THE INVENTION

The present invention relates to a semiconductor memory device and, more particularly, to a synchronous burst memory device with a pipelined multi-bit prefetch architecture.

BACKGROUND OF THE INVENTION

FIG. 1 is a block diagram illustrating a conventional synchronous burst pipelined SRAM (Static Random Access Memory) device operating in synchronism with an externally applied clock signal. The SRAM device 100 integrates an SRAM core with synchronous peripheral circuitry. The SRAM device 100 has a mode of write operation in which the write data are written into memory cells at least one clock cycle after the addresses and control inputs have been presented.

The prior art memory device 100 can access data in response to both rising and falling edges of an external clock signal CK (or CK#), as well as accessing the rising (or falling) edge of the clock signal. In other words, the device 100 can operate in either one of the single data rate (SDR) and double data rate (DDR) modes of operation. The SDR mode of operation allows a user to read or write a single word on every rising edge of the clock signal CK, and the DDR mode allows a read or write operation in synchronism with both the rising and the falling clock edges of the clock signal CK.

The SRAM device 100 includes a clock buffer 102, an address register 104, a burst address sequence counter 106, a write address register 108, 2×1 multiplexers 110, 124a, 124b, 124c, 136 and 138, an address decoder 112, an SDR/DDR output control logic 114, an address comparator 116, logic gates 118 and 150, data input registers 120 and 122, a write register 126, a write driver 128, a memory cell array 130, a sense amplifier circuit 132, an output register 134, an output buffer 140, a data rate register 142, a read/write enable register 144, an output enable register 148, and echo clock buffers 152 and 154.

To the SRAM device 100, a data rate signal SD/DD# indicating the SDR or DDR mode and a burst type signal LBO# indicating a linear or interleaved burst type are externally applied. In SDR mode, write data are registered on the rising of the clock signal CK. In DDR mode, write data are registered on both the rising and falling edges of the clock signal CK. Read data are driven on the rising edge of the clock signal CK in SDR mode and on the rising and falling edges of the clock signal CK in DDR mode. Address signals SA0' and SA1' are advanced in the order indicated by the signal LBO#.

FIG. 2 is a timing diagram of the prior art SRAM device 100 shown in FIG. 1. For purposes of explanation, it is assumed that the prior art SRAM device 100 supports burst lengths of 1, 2 and 4, and that the memory device has a two stage delay feature. As can be seen in FIG. 2, when a command DW4 representing a DDR burst write operation with burst length of 4 (hereinafter abbreviated as "DW4 operation") is externally issued in cycle C1 of the external clock signal CK, an external address A0_b as an initial burst address is presented on the rising edge of the external clock signal CK. Since the SRAM device is the late write type, in next cycle C2 of the clock signal CK (i.e., a burst write continue cycle without any external address input), a pair of write data W0b and W0a are sequentially inputted on the rising edge and the falling edge of the clock signal CK, respectively.

During cycle C3 of the clock signal CK, in which a command DW2 representing a DDR burst write operation with burst length of 2 (hereinafter abbreviated as "DW2 operation") is issued, two subsequent write data W0d and W0c corresponding to the command DW4 are also inputted in synchronism with the rising and falling edges of the clock signal CK, respectively. The input sequence of the write data W0d, W0c, W0a and W0b, is determined by the external address A0_b and the selected burst mode (i.e., either interleaved or linear burst mode).

Due to the 2 stage delay write feature of the SRAM device, an internal address WA0_ab for the write data W0b and W0a is generated in cycle C3, and so the data W0b and W0a are written into memory cells selected by decoding the address W0_ba. The reference symbol WA0_ab of the burst write address for the write data W0b and W0a represents that both of the data W0b and W0a having been serially inputted are written into the selected memory cells in parallel.

In cycle C4, a pair of write data W1a and W1b are inputted at the rising and falling edges of the clock signal CK in response to the command DW2 issued in cycle C3. However, when a command DR4 representing a DDR burst read operation of burst length 4 (hereinafter abbreviated as "DR4 operation") is given in cycle C4, a burst address RA2_cd for the DR4 operation is internally generated by using an external address A2_c for the DR4 operation, instead of using the address A1_a for the DW2 operation as an initial burst address. In cycle C4, the write data W0d, W0c, W1a and W1b may be registered and they may not be written into memory cells until the DR4 operation has been completed.

Like cycle C2 with the burst write continue command, there is also no external address input in cycle C5 with a burst read continue command. In this cycle C5, subsequent internal burst address RA2_ab is generated depending upon the external address A2_c and the first read data R2c corresponding to the burst address RA2_cd for the DR4 operation is driven to data bus. The reference symbol RA2_cd (or RA2_ab) of the burst address for the read data R2c and R2d (or R2a and R2b) represents that both of the data R2c and R2d (or R2a and R2b) are read out of the selected memory cells in parallel.

In cycle C6, a command SR1 representing an SDR burst read operation of burst length 1 (hereinafter abbreviated as "SRI operation") is given together with an external address A3_d. In this single read cycle C6, the external address A3_d itself becomes the internal address RA3_d, without generating additional internal address, and the read data R2d and R2a corresponding to the DR4 operation appear on the data bus. As can be seen in FIG. 2, the prior art SRAM device 100 requires a single "no operation (NOP)" cycle without external address input when transitioning from a read cycle to a write cycle even though the NOP cycle is not required when switching from a write cycle to a read cycle. Thus, in cycle C7 of the clock signal CK, an NOP cycle is added for a next write operation which will be executed in subsequent cycle C8. In the NOP cycle C7, the final read data R2b corresponding to the DR4 operation is driven to the data bus without generating internal address and the DR4 operation is completed. Like the above-described burst write operations, the read data output sequence of the data R2c, R2d, R2a and R2b is also determined by both the external address A2_c and the selected burst mode.

In cycle C8 of the clock signal CK, in which a command DW1 representing a DDR burst write operation with burst length of 1 is given together with an external address A4_a, the write data W0d and W0c registered in cycle C4 are written into the memory cells selected by decoding internal address WA0_dc.

As described above, the registered data W0d and W0c for the DW4 operation are written into memory cells in the write cycle C8 since the DR4 and SR1 operations have been completed. However, to write the registered data W0d and W0c into the memory cells designated by the internal address WA0_cd in the first write cycle C8 after the SR1-operation, the memory device has difficulty in setting the burst address sequence counter fast with the internal address WA0_dc because only a single burst address sequence counter 106 (shown in FIG. 1) is used for both read and write operations, resulting in address decoding speed loss.

SUMMARY OF THE INVENTION

Accordingly, it is a general object of the present invention to provide a synchronous burst semiconductor memory device having an improved performance.

It is another object of the present invention to provide a synchronous burst semiconductor memory device which can overcome address decoding timing loss due to use of a single burst address generator.

According to an aspect of the present invention, there is provided a semiconductor memory device, such as an SRAM, a DRAM, a flash EEPROM, a ferroelectric RAM, or the like, which operates in synchronism with an external clock (or, system clock) signal. A major advantage of synchronous memories is that the system clock edge is the only timing strobe that must be provided by the system to the memory. This reduces the need to propagate multiple timing strobes around the printed circuit board or module. Further, the synchronous memory device of the invention accesses data in response to both rising and falling edges of the external clock signal, doubling the data rate of the memory device. Further, the memory device operates in burst read and write modes. These burst mode accesses take advantage of the fact that the internal bus of the memory device is wider than the external bus. This permits all of the data from a series of burst mode addresses to be fetched from the memory device to its outputs upon the entry of the initial address. Two internal address generators are provided for the synchronous memory device of the invention: one of them is intended specifically for burst read operations and the other for burst write operations. The burst read address generator internally generates a series of burst read addresses in response to an external address. The burst write address generator also internally generates a series of burst write addresses in response to an external address. Further, a controller is implemented into the memory device, which controls the operations of the internal address generators in response to externally applied read and write command information.

According to another aspect of the present invention, a synchronous pipelined burst semiconductor memory device capable of accessing data in response to both rising and falling edges of an external clock signal includes a memory cell array having a plurality of memory cells storing data bits, a first address register for temporally holding an external read address, a first internal address generator for receiving an output of the first address register to generate a series of first internal addresses for a burst read operation, a second address register for temporally holding an external write address, and a second internal address generator for receiving an output of the second address register to generate a series of second internal addresses for a burst write operation. The memory device further includes an address selector for selecting output addresses of one of the first and second internal address generators, a controller for controlling the in response to an external write enable signal and an external address enable signal, and an address decoder for decoding an output of the address selector to select the memory cells in response to the external write enable signal. The memory device further includes a first data-in register for temporally holding a first write data, a second data-in register for temporally holding a second write data, the first and second write data being inputted serially a write data sorter for sorting the first and second write data in response to the output of the second internal address generator, and a write driver for writing the sorted data into the memory cells. The memory device further includes a sense amplifier circuit for sensing in parallel and amplifying a first read data and a second read data stored in the memory cells, and a read data sorter for sorting the first and second read data in response to the output of the first internal address generator and outputting the first and second read data in serially.

According to the present invention, since a synchronous semiconductor memory is equipped with separate internal read- and write-dedicated address generators, although a burst write operation is interrupted by a read operation, the internal address generator resetting for the interrupted write operation is not required. Therefore, the memory device can have a shorter internal address decoding time, and as a result the device performance can be improved.

BRIEF DESCRIPTION OF THE DRAWINGS

A more complete appreciation of the present invention, and many of the attendant advantages and features thereof, will become readily apparent as the same becomes better understood by reference to the following detailed description when considered in conjunction with the accompanying drawings in which like reference symbols indicate the same or similar components, wherein.

DETAILED DESCRIPTION OF THE PREFERRED EMBODIMENT

Throughout the following description, specific details are set forth in order to provide a more thorough understanding of the present invention. It will be apparent, however, to one skilled in the art that the present invention may be practiced without these specific details.

It is a key feature that a semiconductor memory device according to the invention uses separate internal address generators for burst read and write operations. These separate burst read and write address generators shorten internal address decoding time so as to improve the device performance.

Herein, an embodiment of the invention will be discussed with reference to an SRAM environment, for the sake of simplicity. It is noted, however, that any other semiconductor memory device, such as a DRAM, a flash EEPROM, and a ferroelectric RAM, can be used to implement the inventive concept of the presently disclosed embodiment. In addition, the semiconductor memory device of the invention can be implemented with an auto-tracking bit line scheme to reduce core cycle time, a shortened main data line for current reduction, a noise immune circuit having high-speed transfer characteristics through a dual-rail reset dynamic circuit, a two-bit prefetched operation, and strobe clocks synchronized with the output data to guarantee processor (or CPU) data-validation time. Accordingly, the specification and drawings are to be regarded in an illustrative, rather than a restrictive sense.

A preferred embodiment of the invention will now be described with reference to the accompanying drawings.

Figure 1:
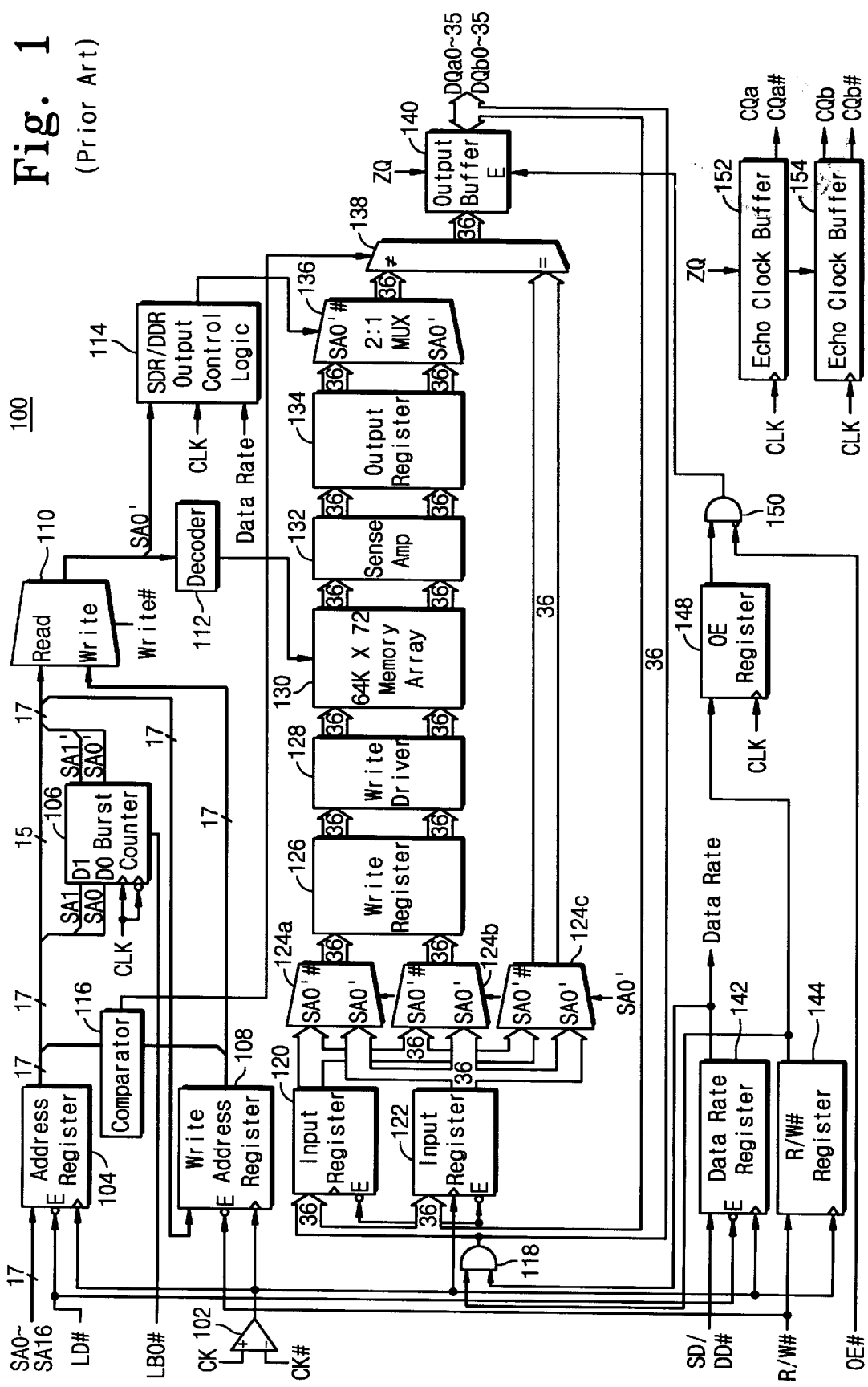
FIG. 1 is a block diagram illustrating a synchronous semiconductor memory device according to the prior art.
Figure 2:
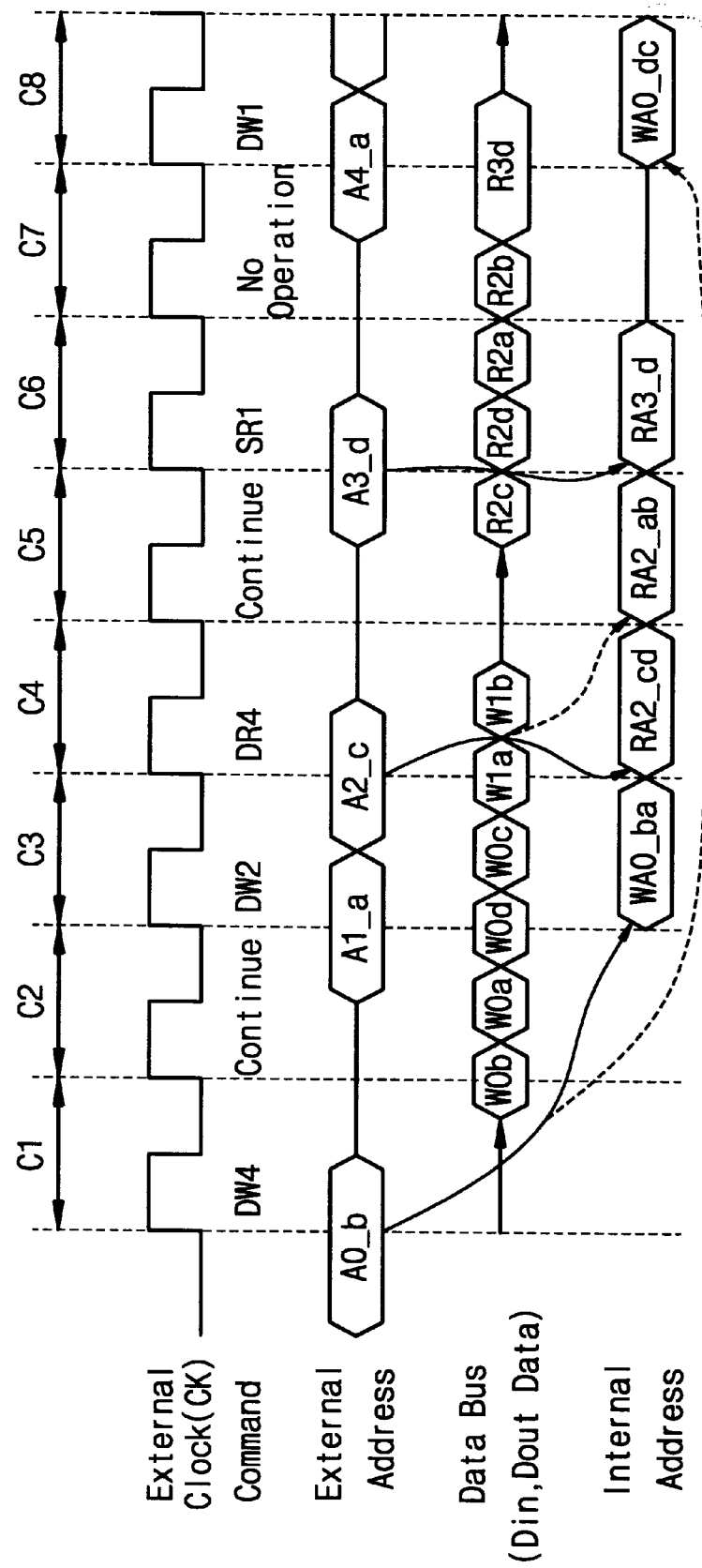
FIG. 2 is a timing diagram of the prior art memory device of FIG. 1.
Figure 3:
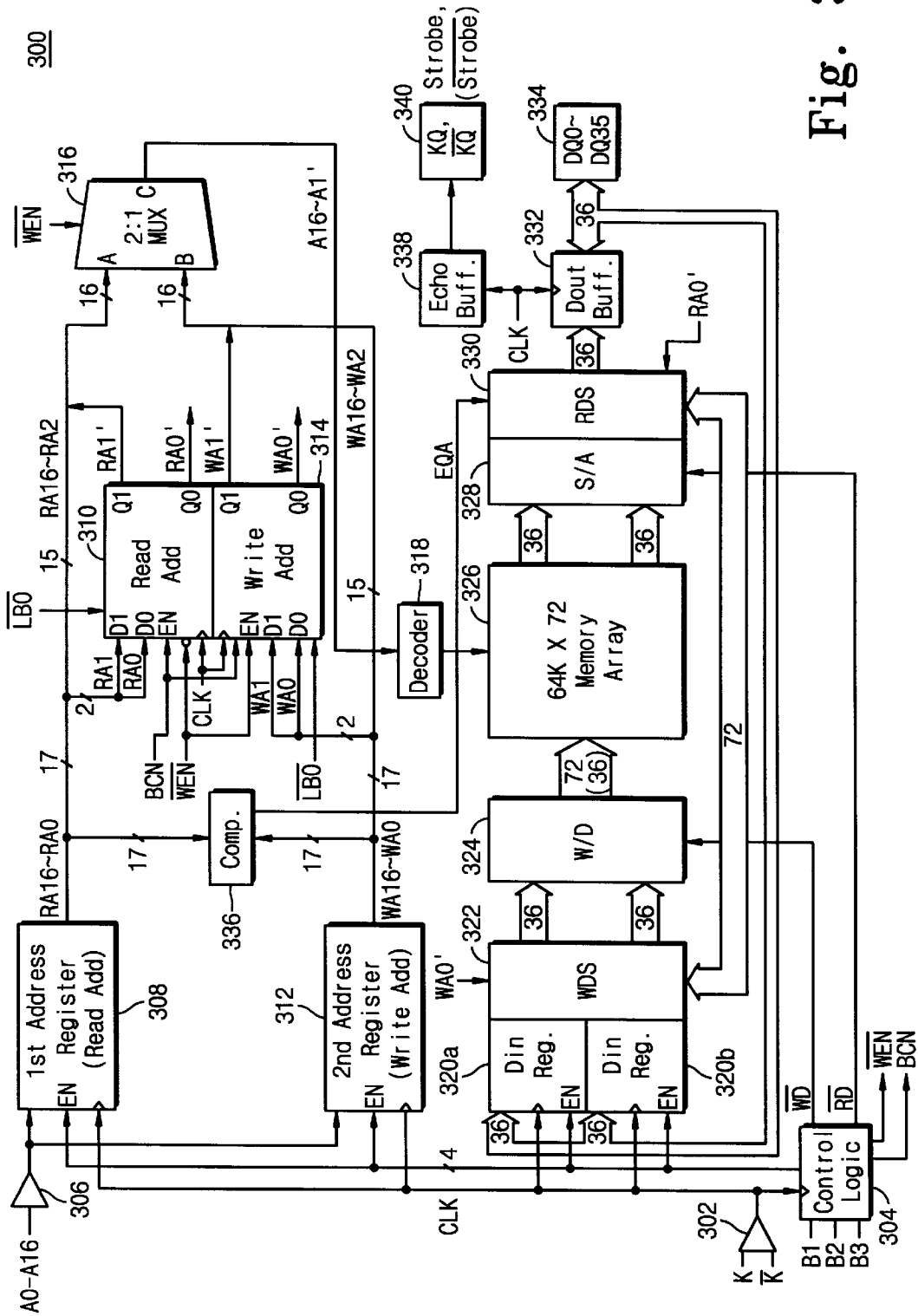
FIG. 3 is a block diagram illustrating a preferred embodiment of a synchronous semiconductor memory device according to the present invention.
Figure 4:
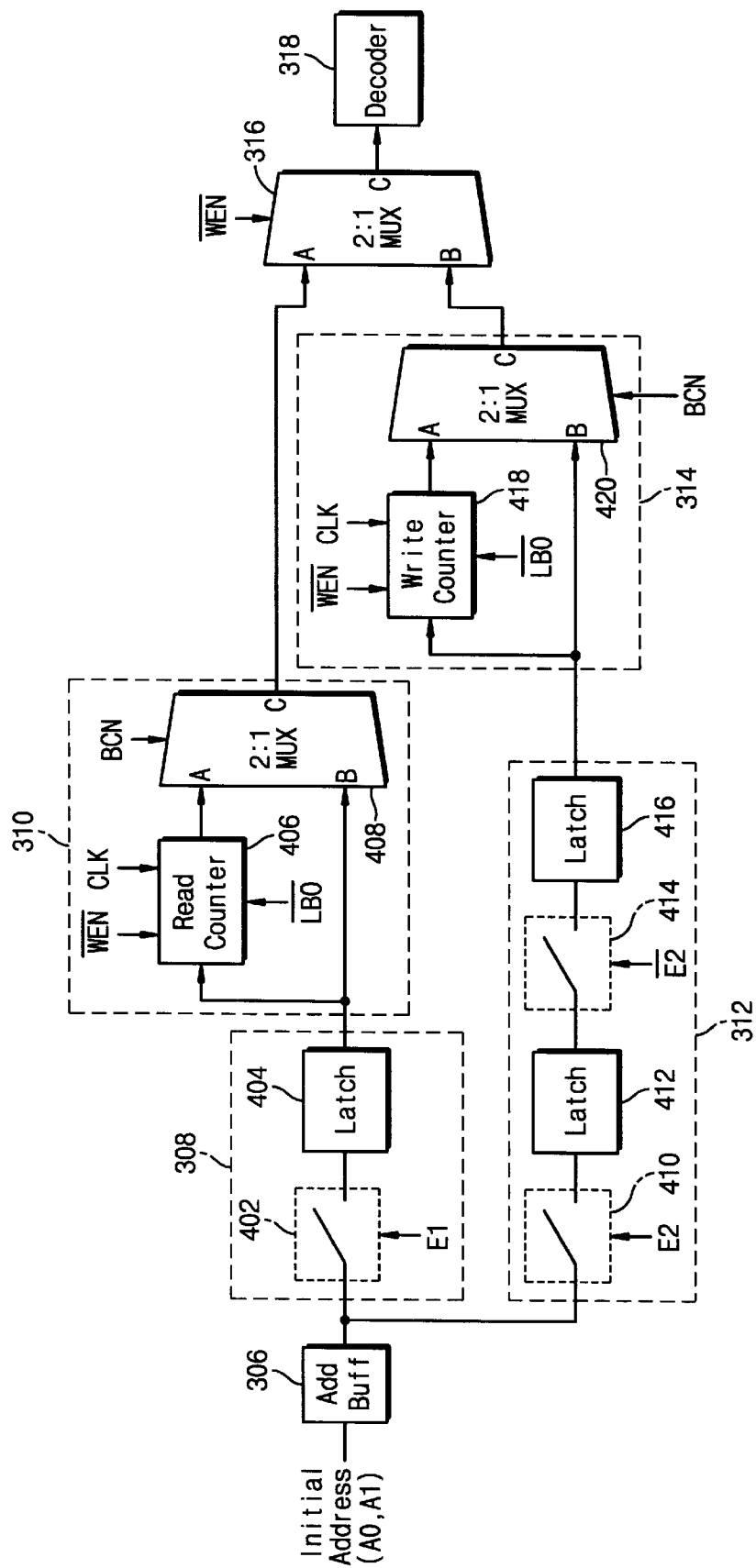
FIG. 4 is a detailed circuit diagram of the circuitry on read and write address paths of the memory device of FIG. 3.

FIG. 3 is a block diagram illustrating a preferred embodiment of a synchronous pipelined burst SRAM device according to the present invention, and FIG. 4 is a detailed circuit diagram illustrating the circuits on read and write address paths of the memory device of FIG. 3. In these figures, well-known circuits are shown in block diagram form in order not to obscure the present invention, and only for simplicity it is also assumed that the SRAM device of the invention supports a maximum burst length of 4 and has a two stage delay feature (i.e., write latency of 2 cycles).

Referring first to FIG. 3, the synchronous pipelined burst SRAM device 300 operates in synchronism with externally applied differential clock signals K and $\overline{K}$. A clock buffer 302 generates an internal clock signal CLK in synchronism with the external clock signals K and $\overline{K}$. The SRAM device 300 includes a memory cell array 326 consisting of 4 mats, although not shown. Each mat consists of 3 blocks and has 9 I/Os. Each block with 3 I/Os is divided into 8 sub-blocks each having a capacity of 64 Kb. The memory device 300 is applied with a 17-bit external address A0–A16. The address signals A0–A16 are fed to first and second address registers 308 and 312 through an address buffer 306. The registers 308 and 312 temporally hold the address signals A0–A16, respectively. Further, first and second data-in registers 320a and 320b each having a 36-bit wide bus are incorporated to enhance pipelined write cycles and reduce read-to-write turnaround time.

The SRAM device 300 has a "late write" mode of operation in which write data are written into its memory cells one or more clock cycles later after the addresses and control inputs have been presented. This mode enables to minimize the number of the idle cycles which normally occur when a read operation is followed by a write operation. Further, the memory device 300 operates in burst read and write modes.

Also, the memory device 300 has both normal SDR (Single Data Rate) and DDR (Double Data Rate) modes of operation. That is, the memory device 300 is capable of accessing data in response to both rising and falling edges of the external clock signal K (or $\overline{K}$) (DDR mode), as well as accessing either rising or falling edge of the clock signal K (or $\overline{K}$) (SDR mode).

Additionally, if a read command is issued while the SRAM device 300 is performing a write operation, the memory device 300 temporally stores addresses and data for the write operation in its registers because the memory device 300 can not write the last data word into its memory cells without conflicting with the read operation. The remaining write data stays in the registers until a next write cycle occurs. On the first write cycle after the read cycle(s), the registered data from the earlier write cycle are written into the memory cells. This is called a "posted write" function.

In the SRAM device 300, all synchronous inputs pass through the registers controlled by the clock signal K (or CLK). The synchronous inputs are latched on the rising edge of the clock signal. The synchronous inputs include all addresses A0–A16, all data inputs DQ0–DQ35, a synchronous load signal B1, a read/write (R/W) enable signal B2, and a data rate signal B3 for selecting one of the SDR and DDR operation modes.

As can be seen in FIG. 3, a control logic 304 receives the synchronous load signal B1, the R/W select signal B2, and the data rate signal B3 in synchronism with the internal clock signal CLK. The synchronous load signal B1 goes low when a bus cycle sequence is to be defined. This definition includes address, data transfer direction and data length. The R/W select signal B2 designates access type (read or write). The read operation is available when the signal B2 is high but the write operation is available when the signal B2 is low. Also, the signal B2 designates whether a burst cycle is performed when the signal B1 is high.

The SRAM device 300 further includes several asynchronous control inputs, such as an output enable signal (not shown), and a burst type signal $\overline{LBO}$. The signal $\overline{LBO}$ allows a choice of either an interleaved burst or a linear burst.

In SDR write operation, data are registered on the rising edge of the clock signal K; in DDR write operation, data are registered on both the rising and falling edges of the clock signal K. Read data are driven on the rising edge of the clock signal K in SDR mode and on the rising and falling edges of the clock signal K in DDR mode.

The internal addresses are advanced when the signal B2 is high, but no operation (NOP) is performed when the signal B2 is low. The data rate signal B3 is sampled by the control logic 304 on the rising edge of the clock signal CLK (or K) while the synchronous load signal B1 is low. At this time, the SRAM device 300 can perform a SDR read or write operation. If the signal B3 is sampled low, a DDR read or write operation can be performed at every clock edge of the clock signal CLK (or K).

The control logic 304 and generates a plurality of internal control signals, such as register enable signals E1 through E4, a write rate signal $\overline{WD}$ indicating the data rate of a write operation (DDR write or SDR write), a read rate signal $\overline{RD}$ for indicating the data rate of a read operation (DDR read or SDR read), a write enable signal $\overline{WEN}$, and a burst continue signal BCN for enabling subsequent burst addresses to be generated internally.

Meanwhile, among outputs RA0–RA16 of the first address register 308, two LSB (Least Significant Bit) address signals RA1 and RA0 are loaded into a first internal address generator 310 used as a burst read address generator. Other output signals RA2–RA16 of the address register 308 are directly provided to an address selector 316, such as a 2×1 multiplexer. Similarly, two bit output signals WA1 and WA0 of the second address register 312 are loaded into a second internal address generator 314 used as a burst write address generator. Other output signals WA2–WA16 of the register 312 are provided to the address selector 316. Both of the internal address generators 310 and 314 operate in synchronism with the internal clock signal CLK and supplied with the burst continue signal BCN, the write enable signal $\overline{WEN}$ and the burst type signal $\overline{LBO}$. The first internal address generator 310 generates burst read address signals RA0' and RA1'. The second internal address generator 314 generates burst write address signals WA0' and WA1'. The address signals RA0', RA1', WA0' and WA1' are advanced in the order indicated by the signal $\overline{\text{LBO}}$ at each clock edge in DDR operation, but only at each rising edge in SDR operation. The burst read address signal RA1' is supplied to an input A of the address selector 316 together with the address signals RA2–RA16 from the first address register 308. The burst write address signal WA1' is applied to the other input B of the address selector 316 together with the address signals WA2–WA16 from the second address register 312.

Referring to FIG. 4, the first address register 308 includes a switch circuit 402 connected to the address buffer 306 and a latch circuit 404 connected to the switch circuit 402. The switch circuit 402 is closed/opened in response to the control signal E1 from the control logic 304 (shown FIG. 3). The first internal address generator 310 includes a counter 406 connected to the latch circuit 404 and a 2×1 multiplexer 408. The counter 406 operates in synchronism with the internal clock signal CLK and also controlled by the burst type signal $\overline{\text{LBO}}$ from the control logic 304. The counter 406 generates burst read address signals RA0' and RA1' in synchronism with the internal clock signal CLK. The sequence of the address signals RA0' and RA1' is determined by the burst type signal $\overline{\text{LBO}}$ from the control logic 304. The multiplexer 408 has two inputs A and B of which one receives an output of the counter 406 and the other does an output of the latch circuit 404. The multiplexer 408 selectively outputs one of its two inputs in response to the burst continue signal BCN from the control logic 304. An output of the multiplexer 408 is provided to an input A of the address selector 316.

The second address generator 312 includes two switch circuits 410 and 414, and two latch circuits 412 and 416. The switch circuit 410 is connected between the address buffer 306 and the latch circuit 412. The switch circuit 414 is connected between the latch circuits 412 and 416. The switch circuit 410 is controlled by the control signal E2 from the control logic 304. The switch circuit is 414 controlled by the inverted signal $\overline{\text{E2}}$ of the control signal E2. The switch circuits 402, 410, and 414 can be implemented with either MOS transistors or CMOS transmission gate circuits. The number of latch circuits is determined by the write latency.

The second internal address generator 314 includes a counter 418 connected to the latch circuit 416 and a 2×1 multiplexer 420. The counter 418 generates burst write address signals WA0' and WA1' in synchronism with the internal clock signal CLK. The sequence of the address signals WA0' and WA1' is determined by the burst type signal $\overline{\text{LBO}}$ from the control logic 304. The multiplexer 420 has two inputs A and B of which one receives an output of the counter 418 and the other does an output of the latch circuit 416. The multiplexer 420 selects one of its two inputs in response to the burst continue signal BCN from the control logic 304. An output of the multiplexer 420 is provided to an input B of the address selector 316. The decoder 318 is supplied with an output of the address selector 316. Herein, it should be noted in other versions of the invention that the first and second internal address generators 310 and 314 can be implemented as the read and write address generators, respectively.

As described above, the synchronous pipelined burst SRAM device 300 has separate internal read- and write-dedicated address generators 310 and 314, and so it is unnecessary to set the internal address generator with the registered address during the posted write cycles after read cycle(s). Therefore, the internal address decoding time of the SRAM device 300 can be reduced, compared to the prior art memory device.

Referring back to FIG. 3, the address selector 316 selects one of both the burst read address signals RA1'–RA16 and the burst write address signals WA1'–WA16 in response to the write enable signal $\overline{\text{WEN}}$. The burst read address signals RA1'–RA16 are selected when the write enable signal $\overline{\text{WEN}}$ is high and the burst write address signals WA1'–WA16 are selected when the signal $\overline{\text{WEN}}$ is low. An output of the address selector 316 is provided to the decoder 318. The decoder 318 selects rows and columns of the memory cell array 326 by decoding the 16-bit address A1'–A16 from the address selector 316.

The data-in registers 320a and 320b hold two successive 36-bit data being serially inputted, respectively. The outputs of the registers 320a and 320b are simultaneously provided to a write data sorter 322.

The write data sorter 322 switches the transfer paths of the two 36-bit outputs of the data-in registers 320a and 320b depending on the address signal WA0' from the second internal address generator 314. For example, when the address signal WA0' is high, the outputs of the registers 320a and 320b are sorted into the higher order 36-bit data and the lower order 36-bit data, respectively, and vice versa. When the signal WA0' is low, the outputs of the registers 320a and 320b are switched inversely. The sorted write data of 72 bits are provided to a write driver 324.

The write driver 324 writes the data of either 72 or 36 bits into the memory cell array 326 in response to the write rate signal $\overline{\text{WD}}$ from the control logic 304. When the signal $\overline{\text{WD}}$ is low (i.e., DDR write mode), the 72-bit data is written into the memory cell array 326. When the signal $\overline{\text{WD}}$ high (i.e., SDR write mode), the 36-bit data is written into the memory cell array 326.

The sense amplifier circuit 328 senses and amplifies the 72- or 36-bit data from the memory cell array 326 in response to the read rate signal $\overline{\text{RD}}$ from the control logic 304. The sense amplifier circuit 328 senses a 72-bit data from the memory cells selected by the decoder 318 when the signal $\overline{\text{RD}}$ is low (i.e., DDR read mode), and the sense amplifier circuit 328 senses a 36-bit data when the signal $\overline{\text{RD}}$ high (i.e., SDR read mode). The output data of the sense amplifier circuit 328 is provided to a read data sorter 330.

During the DDR mode, the read data sorter 330 divides the 72-bit output data into two 36-bit data and sorts them into a higher order data and a lower order data depending on the address signal RA0' from the first internal address generator 310, and vice versa. The sorted data are sequentially outputted through data-out buffer 332 to output pads 334.

An address comparator 336 is enabled only when a write operation is pending and a read operation is requested. The comparator 336 compares the output address of the first address register 308 with the output address of the second address register 312. If the addresses are identical with each other, the comparator 336 generates a comparison signal EQA of active high level, and if not, it generates the comparison signal of inactive low level. When the signal EQA goes high, the data held in the data-in registers 320a and 320b are routed directly to the read data sorter 330, bypassing the memory cell array 326. Thus, a read operation can be made immediately to an address even if that address was written in the previous cycle. During this read cycle, the memory cell array 326 is bypassed by the comparator 336, and data is read instead from the data-in register 320a or 320b storing the recently written data.

Echo clock buffer 338 generates differential echo clock signals KQ and $\overline{\text{KQ}}$ as output data strobe signals, in synchronism with the clock signal CLK (or K). The output data DQ0–DQ35 are closely matched to the echo clock signals KQ and $\overline{KQ}$. The echo clock signals KQ and $\overline{KQ}$ are not disabled by any control signals and always match the frequency of the clock signal CLK (or K).

Figure 5:
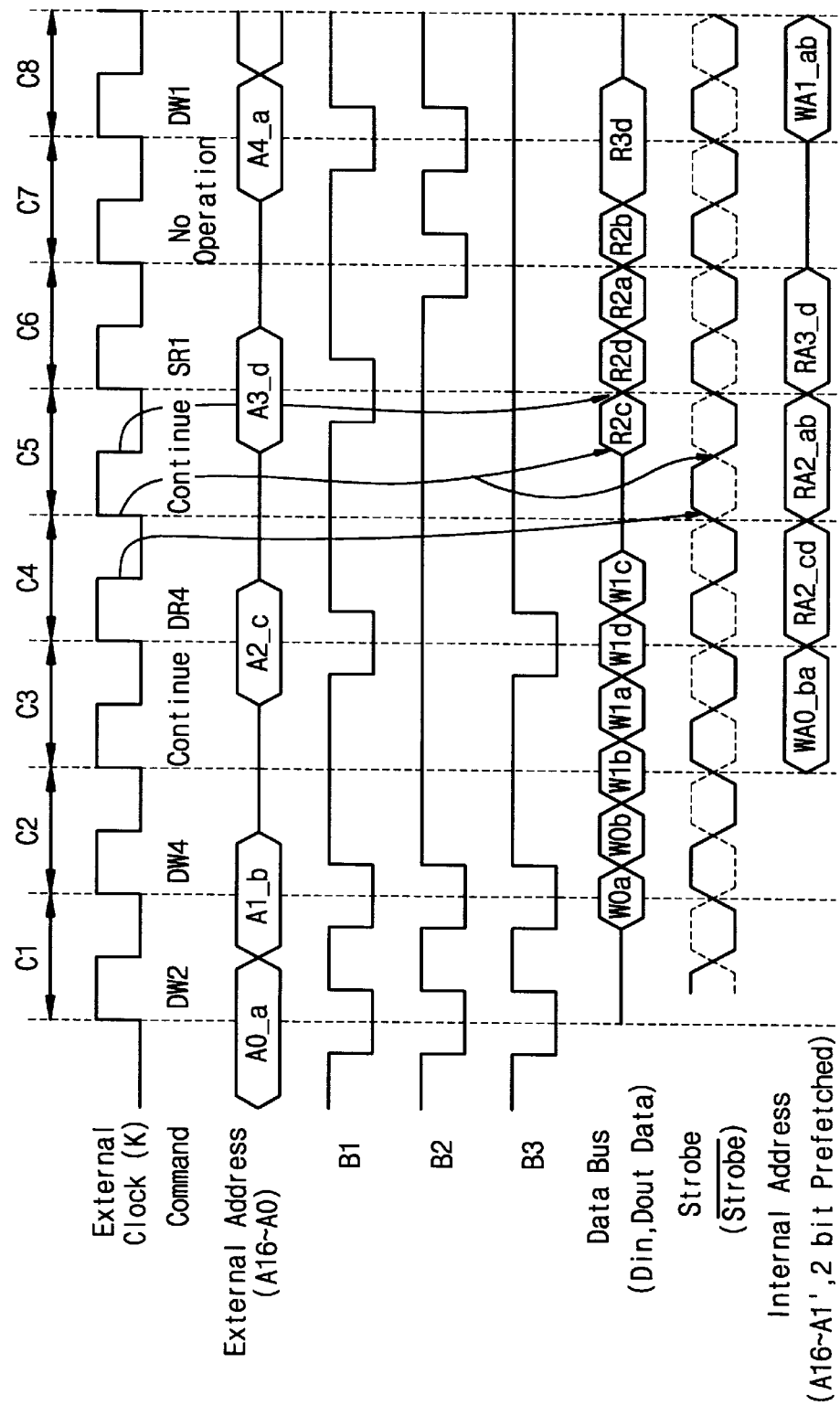
FIG. 5 is a timing diagram of the memory device of FIG. 3.

FIG. 5 is a timing diagram of the SRAM device 100 shown in FIG. 3. For purposes of explanation, it is assumed that the DDR SRAM device 300 supports burst lengths of 1, 2 and 4, and that the memory device has two stage delay features.

Referring to FIG. 5, in cycle C1 of the external clock K, if a command DW2 representing a DDR burst write operation (all the external control signals B1, B2 and B3 are low) with burst length of 2 is issued while an external address A0_a is presented as an initial burst address, write data W0a and W0b corresponding to the DW2 command are sequentially inputted in cycle C2 of the clock signal K because the SRAM device 300 is the late write type.

Next, if a command DW4 representing a DDR burst write operation with burst length of 4 is given while an external address A1_b is presented, write data corresponding to the DW4 command are sequentially inputted in cycles C3 and C4 of the clock signal K.

During cycle C3 of the clock signal K, in which a continue command of the DW4 command is issued, an internal address WA0_ab for writing the data W0a and W0b into memory cells is generated according to the 2 stage delay write feature. The reference symbol WA0_ab of the burst write address for the write data W0a and W0b represents that both of the data W0a and W0b having been inputted serially are simultaneously written into the selected memory cells in parallel.

In cycle C4, if a command DR4 representing a DDR burst read operation (the external control signals B1 and B3 are low, B2 is high) of burst length 4 is issued while an external address A2_c is presented as an initial burst address, due to the posted write feature of the SRAM device 300, a burst address RA2_cd for the DR4 operation is internally generated by using the external address A2_c. In accordance with the posted write feature, the write data W1b, W1a, W1d and W1c are registered until the DR4 operation has been completed.

In cycle C5 with a burst read continue command, a sequent internal burst address RA2_ab is generated and the first read data R2c corresponding to the burst address RA2_cd for the DR4 operation is driven to data bus on the falling edge of the clock signal K.

In cycle C6, if a command SR1 representing an SDR burst read operation (the external control signal B1 is low, B2 and B3 are high) of burst length 1 is given along with an external address A3_d, the external address A3_d becomes the internal address RA3_d without generating additional internal address and the read data R2d and R2a corresponding to the DR4 operation appear on the data bus. The reference symbol RA2_cd (or RA2_ab) of the burst address for the read data R2c and R2d (or R2a and R2b) represents that both of the data R2c and R2d (or R2a and R2b) are read out of the selected memory cells in parallel.

As can be seen in FIG. 5, the SRAM device 300 requires a single "NOP (no operation)" cycle (the external control signals B1 and B3 are high, B2 is low) without external address input when transitioning from a read cycle to a write cycle although the NOP cycle is not required when switching from a write cycle to a read cycle. Thus, in cycle C7 of the clock signal K, an NOP cycle is added for a next write operation which will be executed in subsequent cycle C8.

During the NOP cycle C7, the final read data R2b corresponding to the DR4 operation is driven to the data bus without generating internal address, completing the DR4 operation. The read data output sequence of the data R2c, R2d, R2a and R2b is determined by the external address A2_c and the selected burst mode.

In cycle C8 of the clock signal K, while a command DW1 representing a DDR burst write operation (the external control signals B1 and B2 are low, B3 is high) with burst length of 1 is given together with an external address A4_a, the write data W1b and W1a registered in cycle C4 are written into the memory cells selected by decoding internal address WA1_ab.

According to the present invention, since separate internal burst read and write address generators are provide for a synchronous burst semiconductor memory device, the memory device can shorten internal address decoding time in the posted write mode, and as a result the device performance can be improved.

The above description of the preferred embodiment of the present invention is intended to be utilized as an illustration of the concept of the present invention. The scope of the present invention is by no means limited by this embodiment. The scope of the present invention shall be defined in the following claims.

What is claimed is:

1. A semiconductor memory device operating in synchronism with an external clock signal, comprising:
   a memory cell array including a plurality of memory cells storing data bits;
   a first internal address generator responsive to an external address, for generating a series of first internal addresses for a read/write operation;
   a second internal address generator responsive to the external address, for generating a series of second internal addresses for a write/read operation;
   an address selector for selecting outputs of one of the first and second internal address generators;
   a controller for controlling operations of the first and second internal address generators, and the address selector, in response to externally applied read and write command information; and
   an address decoder for decoding an output of the address selector to select the memory cells, in response to the externally applied read and write command information.

2. The memory device according to claim 1, wherein the memory device accesses the data bits on both rising and falling edges of the external clock signal.

3. The memory device according to claim 1, wherein the memory device is a static random access memory (SRAM) device.

4. The memory device according to claim 1, wherein the memory device is a dynamic random access memory (DRAM) device.

5. A synchronous semiconductor memory device operating in burst read and write modes, the memory device comprising:
   a memory cell array including a plurality of memory cells storing data bits;
   a first address register for temporally holding an external address;
   a first internal address generator for receiving an output of the first address register to generate a series of first internal addresses for a burst read operation;

a second address register for temporally holding the external address;

a second internal address generator for receiving an output of the second address register to generate a series of second internal addresses for a burst write operation;

an address selector for selecting output addresses of one of the first and second internal address generators;

a controller for controlling an operation of the address selector, in response to at least an external write enable signal; and an address decoder for decoding an output of the address selector to select the memory cells, in response to the external write enable signal.

6. The memory device according to claim 5, further comprising:

a first data-in register for temporally holding a first write data;

a second data-in register for temporally holding a second write data;

the first and second write data being inputted serially;

a write data sorter for sorting the first and second write data in response to the output of the second internal address generator; and a write driver for writing the sorted data into the memory cells.

7. The memory device according to claim 5, further comprising:

a sense amplifier circuit for sensing in parallel and amplifying a first read data and a second read data stored in the memory cells; and a read data sorter for sorting the first and second read data in response to the output of the first internal address generator and outputting the first and second read data serially.

8. The memory device according to claim 5, wherein the memory device is a static random access memory (SRAM) device.

9. The memory device according to claim 5, wherein the memory device is a dynamic random access memory (DRAM) device.

10. The memory device according to claim 5, wherein at least one of said first and second internal address generators includes:

a counter operating in synchronism with an internal clock signal; and a multiplexer for selecting one of an output of said first address register and an output of said counter.

11. The memory device according to claim 10, wherein said counter operates in response to a write enable signal.

12. The memory device according to claim 10, wherein said multiplexer operates in response to a burst continue signal for enabling subsequent burst addresses to be generated internally.

13. The memory device according to claim 1, wherein at least one of said first and second internal address generators includes:

a counter operating in synchronism with an internal clock signal; and a multiplexer for selecting one of an output of said first address register and an output of said counter.

14. The memory device according to claim 13, wherein said counter operates in response to a write enable signal.

15. The memory device according to claim 13, wherein said multiplexer operates in response to a burst continue signal for enabling subsequent burst addresses to be generated internally.

* * * * *

UNITED STATES PATENT AND TRADEMARK OFFICE
CERTIFICATE OF CORRECTION

PATENT NO. : 6,134,180
DATED : October 17, 2000
INVENTOR(S) : Kim et al.

It is certified that error appears in the above-identified patent and that said Letters Patent is hereby corrected as shown below:

Column 3,
Line 10, "WA0_cd" should read -- WA0_dc --.

Column 6,
Line 8, "DQO-DQ35" should read -- DQ0-DQ35 --.

Column 7,
Line 37, "circuit is 414 controlled" should read -- circuit 414 is controlled --.

Signed and Sealed this

Second Day of April, 2002

Attest:

JAMES E. ROGAN
*Attesting Officer*     *Director of the United States Patent and Trademark Office*